US010916578B2

(12) United States Patent
Hachisu

(10) Patent No.: US 10,916,578 B2
(45) Date of Patent: Feb. 9, 2021

(54) SEMICONDUCTOR APPARATUS AND CAMERA

(71) Applicant: CANON KABUSHIKI KAISHA, Tokyo (JP)

(72) Inventor: Takahiro Hachisu, Isehara (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 27 days.

(21) Appl. No.: 16/265,044

(22) Filed: Feb. 1, 2019

(65) Prior Publication Data

US 2019/0252327 A1 Aug. 15, 2019

(30) Foreign Application Priority Data

Feb. 14, 2018 (JP) ................................ 2018-024335

(51) Int. Cl.
*H01L 31/0203* (2014.01)
*H01L 27/146* (2006.01)
(Continued)

(52) U.S. Cl.
CPC ...... *H01L 27/1464* (2013.01); *H01L 23/3114* (2013.01); *H01L 23/481* (2013.01); *H01L 23/562* (2013.01); *H01L 27/146* (2013.01); *H01L 27/14601* (2013.01); *H01L 27/14618* (2013.01); *H01L 27/14632* (2013.01);
(Continued)

(58) Field of Classification Search
CPC ................. H01L 23/562; H01L 27/146; H01L 27/14601; H01L 27/14618; H01L 27/14687; H01L 27/14645; H01L 27/14636; H01L 23/481; H01L 23/3114; H01L 27/14632; H01L 27/1464
See application file for complete search history.

(56) References Cited

U.S. PATENT DOCUMENTS 8,928,803 B2 1/2015 Shimizu
9,041,161 B2 * 5/2015 Takachi ................. H01L 24/94
257/618

(Continued)

FOREIGN PATENT DOCUMENTS

JP 2002-270806 A 9/2002
JP 2003-092312 A 3/2003
(Continued)

*Primary Examiner* — Shouxiang Hu
(74) *Attorney, Agent, or Firm* — Venable LLP

(57) ABSTRACT

A semiconductor apparatus in which are bonded a semiconductor substrate, in which a semiconductor element is arranged, and a supporting substrate is provided. A bonding layer for bonding the semiconductor substrate and the supporting substrate is arranged between the supporting substrate and a front side of the semiconductor substrate on the side of the supporting substrate. The bonding layer includes a first resin member arranged in a first region inside of an outer edge of the semiconductor substrate in an orthographic projection to the front side, and a second resin member arranged in a second region between the outer edge of the semiconductor substrate and the first region, in the orthographic projection to the front side. A linear expansion coefficient of the first resin member is less than a linear expansion coefficient of the second resin member.

14 Claims, 4 Drawing Sheets

(51) Int. Cl.
*H01L 23/00* (2006.01)
*H01L 23/31* (2006.01)
*H01L 23/48* (2006.01)

(52) U.S. Cl.
CPC .. *H01L 27/14636* (2013.01); *H01L 27/14645* (2013.01); *H01L 27/14687* (2013.01)

(56) References Cited

U.S. PATENT DOCUMENTS

| | | |
|---|---|---|
| 2002/0090162 A1 | 7/2002 | Asada et al. |
| 2008/0043127 A1 | 2/2008 | Mochizuki et al. |
| 2008/0283951 A1* | 11/2008 | Nabe ............... H01L 21/76898 257/433 |
| 2012/0217606 A1 | 8/2012 | Itonaga |
| 2013/0137259 A1* | 5/2013 | Bieck ............... H01L 21/76898 438/612 |
| 2013/0141606 A1 | 6/2013 | Shimizu |
| 2013/0181313 A1* | 7/2013 | Nagata ............. H01L 27/14634 257/433 |
| 2015/0002711 A1 | 1/2015 | Itonaga |

FOREIGN PATENT DOCUMENTS

| | | |
|---|---|---|
| JP | 2004-349545 A | 12/2004 |
| JP | 2008-078598 A | 4/2008 |
| JP | 2009-246151 A | 10/2009 |
| JP | 2009-246152 A | 10/2009 |
| JP | 2010-205888 A | 9/2010 |
| JP | 2011-009623 A | 1/2011 |
| JP | 2012-182243 A | 9/2012 |
| JP | 2012-182244 A | 9/2012 |
| JP | 2013-118230 A | 6/2013 |
| JP | 2015-192074 A | 11/2015 |
| WO | 2009/119427 A1 | 10/2009 |

* cited by examiner

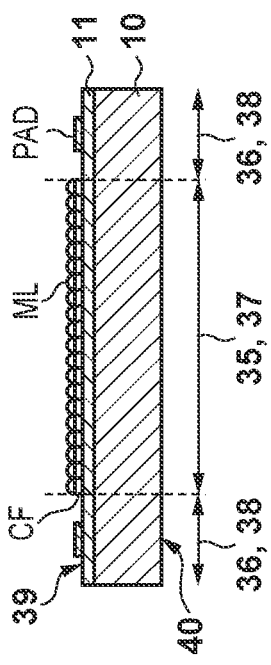
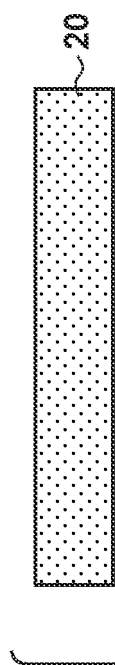
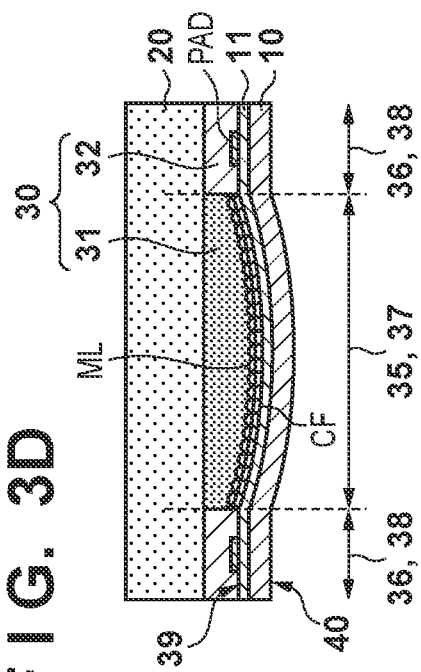
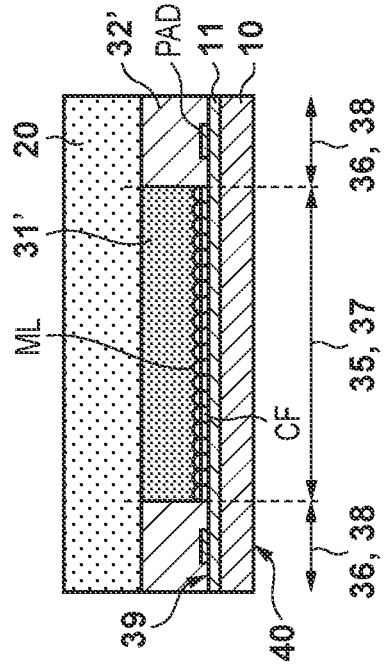
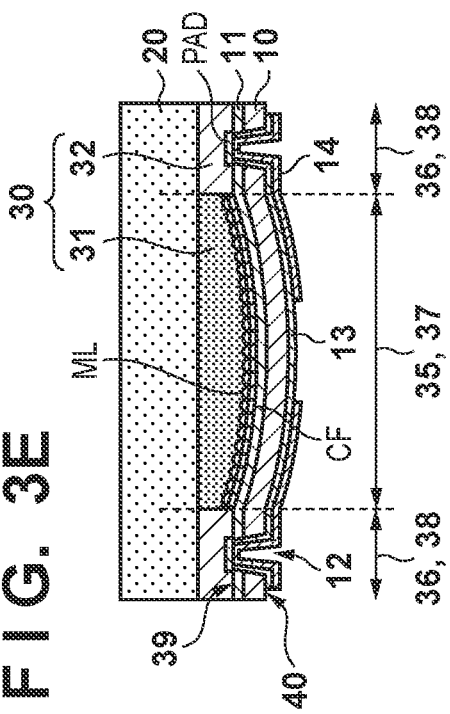

SEMICONDUCTOR APPARATUS AND CAMERA

BACKGROUND OF THE INVENTION

Field of the Invention

The present invention relates to a semiconductor apparatus, a camera, and a method of manufacturing a semiconductor apparatus.

Description of the Related Art

In a semiconductor package technique for bonding a semiconductor substrate in which an semiconductor device is formed and a supporting substrate, controlling warpage of the semiconductor substrate is known. The fourth embodiment of Japanese Patent Laid-Open No. 2013-118230 describes that, in accordance with sealing a semiconductor substrate by using two types of resin having mutually different elastic moduli, a light-transmissive member and the semiconductor substrate which are arranged on a printed substrate maintain a flat state, even if the environment such as the temperature changes. In addition, International Publication No. 2009/119427 describes guaranteeing a distance between a semiconductor substrate and a circuit substrate by bonding the semiconductor substrate and the circuit substrate on a stage provided with a concave portion to thereby control so that the semiconductor substrate curves after packaging.

SUMMARY OF THE INVENTION

In packaging techniques, CSP (Chip Size Package) which enables a packed semiconductor apparatus to be miniaturized to a size of the same degree as that of a mounted semiconductor substrate is known. As described by Japanese Patent Laid-Open No. 2013-118230 and International Publication No. 2009/119427, it is necessary to control warpage of a semiconductor substrate even if the semiconductor substrate and the supporting substrate are of similar sizes as with CSP, and not only when the supporting substrate is larger than the semiconductor substrate.

Some embodiments of the present invention provide a technique that is advantageous in controlling warpage of a semiconductor substrate, in a semiconductor apparatus.

According to some embodiments, a semiconductor apparatus in which are bonded a semiconductor substrate, in which a semiconductor element is arranged, and a supporting substrate, wherein: a bonding layer for bonding the semiconductor substrate and the supporting substrate is arranged between the supporting substrate and a front side of the semiconductor substrate on the side of the supporting substrate, the bonding layer includes a first resin member arranged in a first region inside of an outer edge of the semiconductor substrate in an orthographic projection to the front side, and a second resin member arranged in a second region, out of the semiconductor substrate, between the outer edge of the semiconductor substrate and the first region, in the orthographic projection to the front side and a linear expansion coefficient of the first resin member is less than a linear expansion coefficient of the second resin member, is provided.

According to some other embodiments, a semiconductor apparatus in which are bonded a semiconductor substrate, in which a semiconductor element is arranged, and a supporting substrate, wherein: a bonding layer for bonding the semiconductor substrate and the supporting substrate is arranged between the supporting substrate and a front side of the semiconductor substrate on the side of the supporting substrate, and, for the bonding layer, a resin member is arranged, in an orthographic projection to the front side, in a second region between a first region inside of an outer edge of the semiconductor substrate and the outer edge of the semiconductor substrate, and the semiconductor substrate has a convex shape in a direction away from the supporting substrate, is provided.

According to some other embodiments, a method of manufacturing a semiconductor apparatus in which are bonded a semiconductor substrate, in which a semiconductor element is formed, and a supporting substrate, the method comprising: forming a bonding layer for bonding the supporting substrate and a front side of the semiconductor substrate, wherein the forming the bonding layer comprises: arranging a first resin material on a first region inside of an outer edge of the semiconductor substrate, in an orthographic projection to the front side, arranging a second resin material on a second region, out of the semiconductor substrate, between the outer edge of the semiconductor substrate and the first region, in the orthographic projection to the front side, arranging the supporting substrate on the first resin material and the second resin material, and forming the bonding layer by heating the first resin material and the second resin material and curing the first resin material and the second resin material, and wherein a linear expansion coefficient of the first resin material is less than a linear expansion coefficient of the second resin material, is provided.

According to some other embodiments, a method of manufacturing a semiconductor apparatus in which are bonded a semiconductor substrate, in which a semiconductor element is formed, and a supporting substrate, the method comprising: forming a bonding layer for bonding the supporting substrate and a front side of the semiconductor substrate, wherein the forming the bonding layer comprises: arranging a resin material along an outer edge of the semiconductor substrate in an orthographic projection to the front side, arranging the supporting substrate on the resin material, and forming the bonding layer by heating the resin material and curing the resin material, and wherein the semiconductor substrate has a convex shape in a direction away from the supporting substrate, is provided.

Further features of the present invention will become apparent from the following description of exemplary embodiments (with reference to the attached drawings).

BRIEF DESCRIPTION OF THE DRAWINGS

FIGS. 3A to 3E are views for illustrating a method of manufacturing the semiconductor apparatus illustrated by FIGS. 1A and 1B.

DESCRIPTION OF THE EMBODIMENTS

Figure 1A:
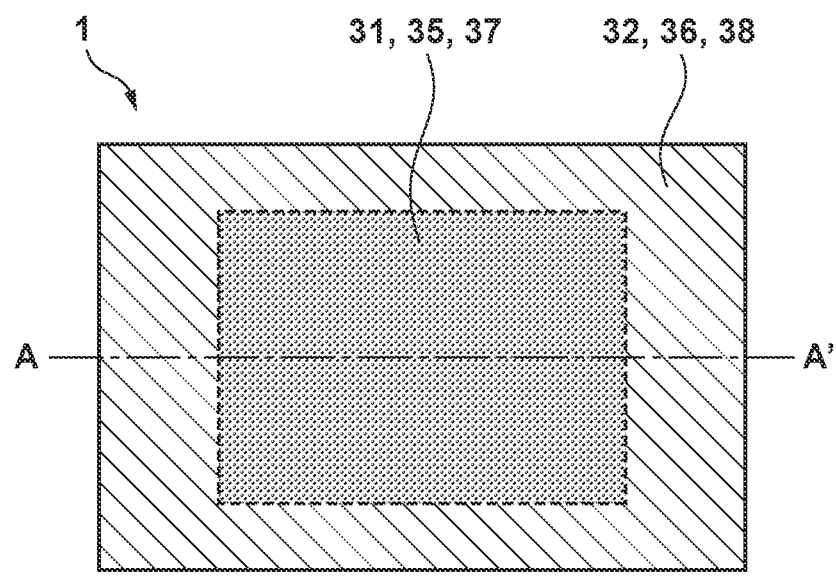
FIGS. 1A and 1B are views for illustrating structural examples of a semiconductor apparatus according to an embodiment of the present invention.

With reference to the attached drawings, description is given below for a detailed embodiment of the semiconductor apparatus according to the present invention. In the following description and drawings, common reference numerals denote common components throughout a plurality of drawings. Accordingly, common configurations are described with mutual reference to the plurality of drawings, and description of configurations to which common reference numerals are given is abbreviated as appropriate.

With reference to FIGS. 1A to 4E, description is given regarding a structure and a method of manufacturing a semiconductor apparatus according to an embodiment of the present invention. FIG. 1A is a top view for illustrating a structure of a semiconductor apparatus 1 in an embodiment of the present invention, and FIG. 1B is a cross-section view between a dashed-dotted line A-A' of FIG. 1A.

Figure 1B:
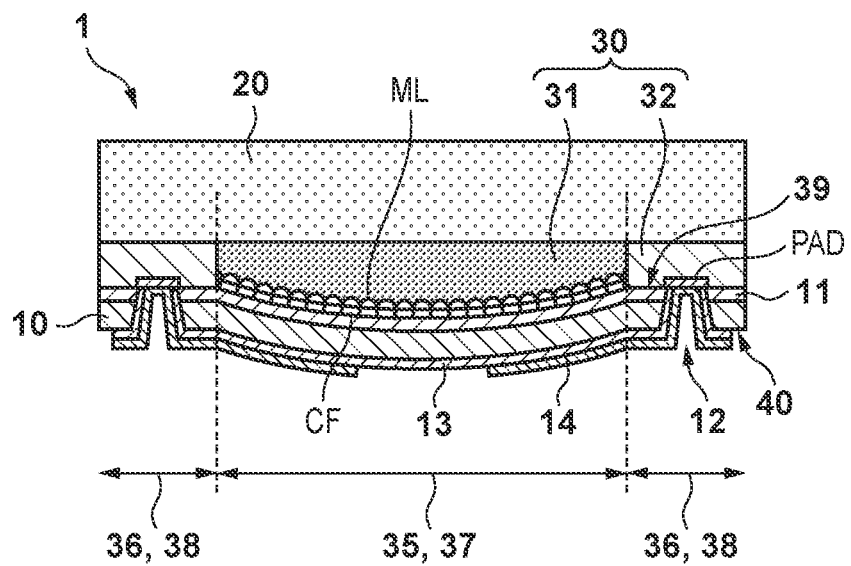

The semiconductor apparatus 1 in the present embodiment includes a semiconductor substrate 10 and a supporting substrate 20. The semiconductor substrate 10 has two main surfaces that face oppositely to each other. In the present specification, the main surface upward in FIG. 1B is referred to as a front side 39, and the downward main surface that is opposite the front side 39 is referred to as a back side 40. In the present embodiment, a semiconductor device 11 that includes a semiconductor element is arranged on the side of the front side 39 of the semiconductor substrate 10. In addition, color filters CF and micro lenses ML are arranged in a top portion of the semiconductor device 11. For example, a semiconductor element included in the semiconductor device 11 may be a photoelectric conversion element such as a photodiode that is formed in the semiconductor substrate 10. Furthermore, a semiconductor element such as a transistor for retrieving a signal converted from light by a photoelectric conversion element may be arranged on the back side 40 of the semiconductor substrate 10. In other words, the semiconductor device 11, which includes the semiconductor substrate 10, may configure a so-called backside illuminated imaging device. With such a configuration, in the present embodiment, description is given by taking as an example a case where the semiconductor device 11 that includes the semiconductor substrate 10 configures an imaging device that includes a plurality of photoelectric conversion elements, color filters CF, and micro lenses ML, in other words the case where the semiconductor apparatus 1 is an image capturing apparatus. However, the semiconductor apparatus 1 is not limited to an image capturing apparatus, and the semiconductor device 11 does not need to include a photoelectric conversion element. For example, the semiconductor device 11 may include a liquid-crystal element or a light-emission element (a light emitting diode) such as an organic electroluminescent element that is arranged on the front side 39 of the semiconductor substrate 10. The semiconductor device 11 that includes a light-emission element or a liquid-crystal element may configure a display device and the semiconductor apparatus 1 may be a display apparatus. Alternatively, for example, the semiconductor device 11 may be a memory or a processor that includes, for example, a transistor formed on the front side 39 of the semiconductor substrate 10.

A wiring layer 14 for making an electrical connection with a mounting substrate (not shown) for mounting the semiconductor apparatus 1 is arranged on the back side 40 of the semiconductor substrate 10. The wiring layer 14 may be also be referred to as a rewiring layer in a packaging technique. The wiring layer 14 is electrically connected with a through electrode (Through Silicon Via: TSV) 12 that is electrically connected to the semiconductor device 11 and penetrates the semiconductor substrate 10 from the front side 39 of the semiconductor substrate 10 to the back side 40. An insulating member 13 for electrically insulating the wiring layer 14 and the semiconductor substrate 10 is arranged between the wiring layer 14 and the semiconductor substrate 10. In the present embodiment, a transparent substrate such as glass or a resin that has optical transparency is used for the supporting substrate 20 in order to allow light to be transmitted to the photoelectric conversion elements of the semiconductor device 11. However, there is no limitation to this, and a suitable material may be selected as appropriate for the supporting substrate 20 in accordance with the configuration of the semiconductor device 11. For example, if there is no need for light to transmit through the supporting substrate 20, a substrate that does not transmit light, such as a metal or a colored resin, or a substrate that tends not to transmit light may be used.

The front side 39 of the semiconductor substrate 10 where the semiconductor device 11 is arranged and which faces the supporting substrate 20, and the supporting substrate 20 are mutually bonded by a bonding layer 30 such as a resin for bonding. In addition to bonding the semiconductor substrate 10 and the supporting substrate 20, the bonding layer 30 may function as a sealing member for sealing the semiconductor device 11 from the outside environment. The bonding layer 30, in an orthographic projection to the front side 39 of the semiconductor substrate 10, includes a resin member 31 arranged in a region 35 inside of the outer edge of the semiconductor substrate 10. In addition, the bonding layer 30, in an orthographic projection to the front side 39 of the semiconductor substrate 10, includes a resin member 32 arranged in a region 36 between the region 35 of the semiconductor substrate 10 and the outer edge of the semiconductor substrate 10. Here, in an orthographic projection to the front side 39 of the semiconductor substrate 10, a region out of the semiconductor device 11 that overlaps with the region 35 in which the resin member 31 is arranged is a region in which the plurality of photoelectric conversion elements are arranged in a two-dimensional array, and may be referred to as an image capturing region 37. In the image capturing region 37, the color filters CF and the micro lenses ML are arranged, as illustrated in FIG. 1B, so as to respectively correspond to the plurality of photoelectric conversion elements. In addition, in an orthographic projection to the front side 39 of the semiconductor substrate 10, a region out of the semiconductor device 11 that overlaps with the region 36 in which the resin member 32 is arranged is a region in which, for example, a peripheral circuit for causing the photoelectric conversion elements arranged in the region 35 to operate is arranged, and may be referred to as a peripheral region 38.

In the present embodiment, a linear expansion coefficient of the resin member 31 is less than a linear expansion coefficient of the resin member 32. When the semiconductor substrate 10 and the supporting substrate 20 are bonded by the resin members 31 and 32, by processing for heating or the like being performed, a bonding (adherence) strength increases, and shrinkage deformation of the resin members 31 and 32 occurs. Because the resin member 32 formed in the region 36 has a larger shrinkage amount than the resin member 31 formed in the region 35, after thermosetting, the semiconductor substrate 10 has a convex shape curve in a direction away from the supporting substrate 20, as illustrated by FIG. 1B. In other words, it is possible to control a curved shape and warpage of the semiconductor substrate 10. For example, a region out of the semiconductor substrate 10 that overlaps with the region 35, in other words, a region out of the semiconductor substrate 10 where the image capturing region 37 of the semiconductor device 11 is arranged may be caused to curve so as to have, with respect to the supporting substrate 20, a convex shape in the direction away from the supporting substrate 20.

In a semiconductor apparatus (image capturing apparatus) which has a planar image capturing region, shift of a focal position may occur between a peripheral portion and a central portion of the image capturing region. In order to suppress aberration that is a shift of the focal position, normally aberration correction is performed by combining a plurality of lenses. In contrast to this, as a method of suppressing aberration that is shift of the focal position in a semiconductor apparatus, a semiconductor apparatus in which a semiconductor substrate that has been turned into a chip is caused to curve to a cylindrical shape or a spherical shape has been proposed. The semiconductor substrate is formed into a curved shape by a method such as pressing each semiconductor substrate into a supporting substrate, decompressing a space between the semiconductor substrate and the supporting substrate via the supporting substrate, and using a stress film to deform the semiconductor substrate itself. Accordingly, there was a problem in that there is a need to secure the semiconductor substrate using a jig or the like, resulting in a large chip size. In addition, in a case where a supporting substrate and a semiconductor substrate as described by International Publication No. 2009/119427 for example are bonded together, the linear expansion coefficient of a resin for bonding the semiconductor substrate and the supporting substrate is high in comparison to that for a connection terminal (typically, a solder material) formed on both ends of the semiconductor substrate. Accordingly, the influence of stress with respect to the front side of the semiconductor substrate will become high. In a case of using the configuration/materials described by International Publication No. 2009/119427 for an image capturing surface of a semiconductor apparatus such as an image capturing apparatus, micro lenses for focusing light are prepared by using an organic material or the like. Accordingly, in the case where the linear expansion coefficient of the resin configuring the bonding layer is high and there is significant change due to shrinkage, it is possible that the shape of the micro lenses will deform due to the deformation when the resin that configures the bonding layer is cured, and the image quality of an obtained image will decrease.

In contrast, in the present embodiment, the bonding layer 30 is only arranged between the semiconductor substrate 10 and the supporting substrate 20, and the bonding layer 30 does not need to be arranged outside of the outer edge of the semiconductor substrate 10. Accordingly, in the present embodiment, in an orthographic projection to the front side 39 of the semiconductor substrate 10, the outer edge of the semiconductor substrate 10 and the outer edge of the supporting substrate 20 are arranged to overlap one another, and it is possible to realize a small CSP. In addition, the resin member 31 which has a lower linear expansion coefficient than that of the resin member 32 arranged in the region 36 is used for, out of the bonding layer 30, the region 35, which overlaps with the image capturing region 37 in which the photoelectric conversion elements, the color filters CF, and the micro lenses ML of the semiconductor device 11 are arranged. Accordingly, at the time of thermosetting for forming the bonding layer 30, the amount of deformation of the resin member 31 is not large, and deformation of the micro lenses ML can be suppressed. As a result, it is possible to improve the image quality of an image obtained by the semiconductor apparatus 1. With such a configuration, in the semiconductor apparatus 1 in which the semiconductor substrate 10 and the supporting substrate 20 are bonded, by arranging the two types of resin members 31 and 32 having mutually different linear expansion coefficients, it is possible to control warpage of the semiconductor substrate 10 without enlarging the semiconductor apparatus 1.

The respective linear expansion coefficients of the resin members 31 and 32 may be greater than or equal to $1 \times 10^{-6}/°$ C. and less than $1 \times 10^{-2}/°$ C., for example. In other words, the respective linear expansion coefficients of the resin members 31 and 32 may have a value from an order of $10^{-6}/°$ C. to an order of $10^{-3}/°$ C. In addition, the linear expansion coefficient of the resin member 31 may be less than or equal to $1/10$ the linear expansion coefficient of the resin member 32. For example, configuration may be such that the linear expansion coefficient of the resin member 31 is in the order of $10^{-5}/°$ C., and the linear expansion coefficient of the resin member 32 is in the order of $10^{-4}/°$ C. According with the size of the semiconductor substrate 10 of the semiconductor apparatus 1 or the size of the image capturing region 37 (the region 35), materials having suitable linear expansion coefficients may be selected as materials for the resin members 31 and 32 to control the degree of warpage of the semiconductor substrate 10.

In addition, for example, the thickness of the semiconductor substrate 10 may be thinner than the thickness of the supporting substrate 20. In addition, for example, the rigidity (for example, Young's modulus) of the semiconductor substrate 10 may be smaller than the rigidity of the supporting substrate. With such a configuration, it will be easier for the semiconductor substrate 10 for which the image capturing region 37 that includes photoelectric conversion elements out of the semiconductor device 11 is arranged to deform.

In the present embodiment, description was given by taking as an example a case where the semiconductor device 11 is an imaging device and the semiconductor apparatus 1 is an image capturing apparatus. However, it is possible to apply the present embodiment to another semiconductor apparatus, such as by causing the semiconductor substrate 10 to curve so as to provide tension or compressive stress to the semiconductor device 11, for example. For example, configuration may be taken to use the two types of resin members 31 and 32 having different linear expansion coefficients for a semiconductor substrate 10 that warps dues to stress occurring between the semiconductor substrate 10 and the semiconductor device 11, to thereby suppress and control the warpage of the semiconductor substrate 10 and have it be level.

Figure 2A:
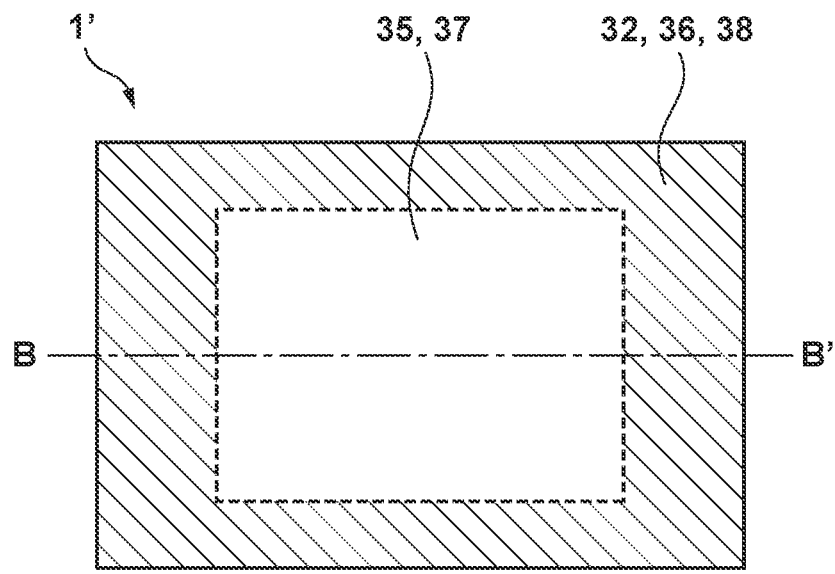
FIGS. 2A and 2B are views for illustrating structural examples of a semiconductor apparatus according to an embodiment of the present invention.
Figure 2B:
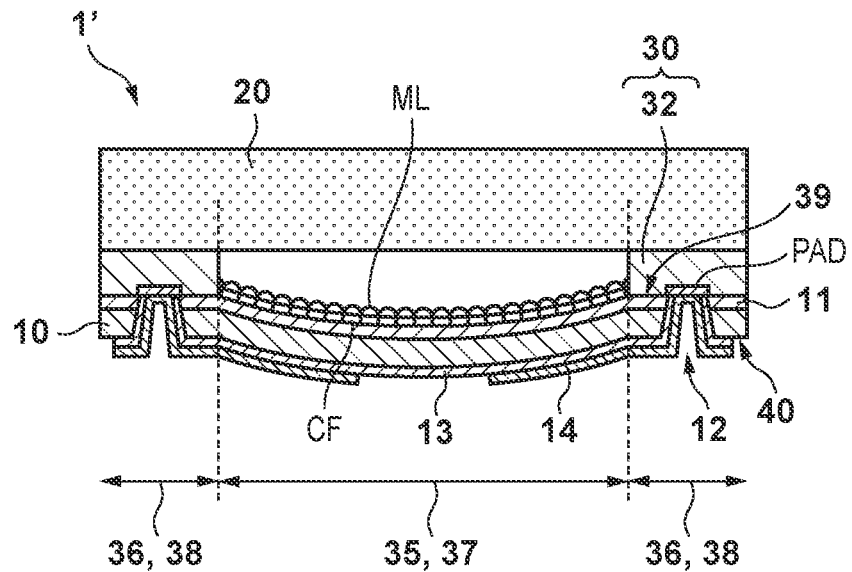

Next, FIGS. 2A and 2B are used to describe a variation of the semiconductor apparatus 1 that was illustrated in FIGS. 1A and 1B. FIG. 2A is a top view for illustrating a structure of a semiconductor apparatus 1' in an embodiment of the present invention, and FIG. 2B is a cross-section view between a dashed-dotted line B-B' of FIG. 2A.

In comparison to the semiconductor apparatus 1, for the semiconductor apparatus 1', the resin member 31 of the bonding layer 30 is not formed in the region 35 that overlaps with the image capturing region 37 of the semiconductor device 11, and only the resin member 32 is arranged in the region 36 that overlaps with the peripheral region 38. In other words, the bonding layer 30 is not arranged in the region 35 that overlaps with the image capturing region 37 of the semiconductor device 11 which is arranged in the semiconductor substrate 10, and the region 35 is hollow.

In order to form the structure as described above, firstly, the supporting substrate 20 and the semiconductor substrate 10 on which the material to be the resin member 32 is formed are set to bonding positions inside a vacuum chamber. Next, after the supporting substrate 20 lightly makes contact with the material of the resin member 32 and the region 35 which overlaps with the image capturing region 37 forms a hollow state while decompressed, the inside of the vacuum chamber is returned to atmospheric pressure so that the semiconductor substrate 10 and the supporting substrate 20 are pressed by the force of atmospheric pressure, and the material of the resin member 32 deforms. As a result, the semiconductor substrate 10 and the supporting substrate 20 are bonded. At a time of bonding the semiconductor substrate 10 and the supporting substrate, when the ultimate vacuum within the vacuum chamber is set to a degree of vacuum approximately half with respect to atmospheric pressure, the thickness of the resin member 32 after bonding deforms to a thickness that is approximately half after atmospheric air opening. As a result, internal pressure for the region 35 becomes pressure that is approximately equal to atmospheric pressure.

At this point in time, because the resin member 32 has not yet been completely cured, by performing processing for heating or the like after bonding, its adhesiveness increases, and shrinkage deformation may also occur. In such a case, when the value of the linear expansion coefficient of the resin member 32 is large, the shrinkage amount of the resin member 32 will be large.

When the shrinkage amount of the resin member 32 is large, the amount of deformation of the resin will also be large. Accordingly, for example, if the thickness of the semiconductor substrate 10 is small in comparison to the thickness of the supporting substrate 20, the semiconductor substrate 10 may curve into a convex shape in a direction away from the supporting substrate 20 in order to maintain internal pressure of the hollow region 35.

The degree and magnitude of the curved shape and warpage of the semiconductor substrate 10 may change according to the size of the semiconductor substrate 10 of the semiconductor apparatus 1', the size of the image capturing region 37 of the semiconductor device 11, or the like. It is possible to control these variables by adjusting the value of the linear expansion coefficient of the resin member 32.

With such a configuration, the region, out of the semiconductor substrate 10, that overlaps with the image capturing region 37 in which the photoelectric conversion elements of the semiconductor device 11 are arranged curves to a convex shape in the direction away from the supporting substrate 20. As a result, similarly to with the semiconductor apparatus 1 described above, a shift in focal positions between the peripheral portion and the central portion of the image capturing region 37 is suppressed in the semiconductor apparatus 1' as well. In addition, it is possible to reduce the number of lenses arranged above the supporting substrate 20 and it is possible to reduce combining.

In addition, for the semiconductor apparatus 1 or 1', which have the curved shapes illustrated in FIGS. 1A, 1B, 2A, and 2B, the semiconductor substrate 10 and the supporting substrate 20 can also be formed in a wafer state. Accordingly, it is possible to, after thermosetting of the bonding layer 30, use a process commonly used in the field of semiconductors such as photolithography, depositing, or etching to form the TSV 12, the wiring layer 14, or the like, and extract each semiconductor apparatus 1 or 1' by dicing. As a result, it is possible to fabricate many chips (semiconductor apparatus 1 or 1') in one go. A semiconductor apparatus 1 or 1' extracted by dicing is arranged so that, in an orthographic projection to the front side 39 of the semiconductor substrate 10, the outer edge of the semiconductor substrate 10 and the outer edge of the supporting substrate 20 overlap each other, and a small CSP can be realized. With such a configuration, in the present embodiment, it is possible to fabricate a plurality of semiconductor apparatuses in which warpage (curved shape) of the semiconductor substrate 10 is controlled by a simpler method, without needing to create the curved shape by using, for example, another jig for each semiconductor apparatus.

Several examples are described below as more detailed examples.

First Example

FIGS. 3A to 3E are schematic drawings for describing each step of a method of manufacturing the semiconductor apparatus 1 described above. A publicly known semiconductor manufacturing process may be used to manufacture the semiconductor apparatus 1. In addition, while description is omitted here, a heating process, a cleaning process, or the like may be performed between steps as necessary.

In the step illustrated in FIG. 3A, firstly the silicon semiconductor substrate 10 is prepared, and the semiconductor device 11 is formed on the front side 39 of the semiconductor substrate 10. An element isolation portion such as an STI (Shallow Trench Isolation) may be formed on the front side 39 of the semiconductor substrate 10, and each element of the semiconductor device 11 may be electrically separated from other elements by the element isolation portion. Subsequently, the semiconductor device 11 is formed by performing a heat process or ion injection in order to form a photodiode to configure a photoelectric conversion element, or form a well, as necessary. In the present example, an imaging device is formed as the semiconductor device 11.

On the front side 39 of the semiconductor substrate 10 on which the semiconductor device 11 is formed, an interlayer insulation layer, a wiring layer and electrodes positioned in the interlayer insulation layer, and an electrically conductive member such as a contact hole for electrically connecting the wiring layer with the semiconductor device 11 are formed. Silicon oxide, silicon nitride, silicon oxynitride, or the like may be used as the interlayer insulation layer. As the interlayer insulation layer in the present example, firstly a BPSG (Boron Phosphorus Silicon Glass) film is formed by a sub-atmospheric pressure CVD method. A contact plug in which electrical conducting material such as tungsten is embedded is formed inside the interlayer insulation layer. In the present example, an electrode inside the interlayer insulation layer is formed by depositing electrical conducting material such as Al using a sputtering method, and patterning the deposited electrical conducting material using a photolithography process and a dry etching process, for example. Silicon oxide is formed by a plasma CVD method as an interlayer insulation layer again on the wiring layer and the electrode.

FIG. 3A simply illustrates the above configuration as the semiconductor device 11, but an electrode formed inside the interlayer insulation layer or in a top layer is separately illustrated as an electrode PAD. By forming the color filters CF and the micro lenses ML on the photoelectric conversion element, the semiconductor device 11 which is an imaging device is completed. Either of an inorganic film such as a silicon nitride film or an organic resin film that has photosensitivity may be selected for the micro lenses ML.

On the front side 39 of the semiconductor substrate 10, a region of the semiconductor device 11 in which mainly the photoelectric conversion element is arranged is set as the image capturing region 37, and a surrounding region in which mainly a driving circuit is formed is set as the peripheral region 38. Although color filters CF and micro lenses ML are not illustrated in the peripheral region 38 in order to simplify the description, they may be provided as necessary such as in a case where high pattern precision is required.

Next, in the step of FIG. 3B, resin materials 31' and 32', which will be the resin members 31 and 32 for configuring the bonding layer 30 described above, are formed on the front side 39 of the semiconductor substrate 10. In the orthographic projection to the front side 39 of the semiconductor substrate 10, the resin material 31' is formed in the region 35 that overlaps with the image capturing region 37 in which the photoelectric conversion element of the semiconductor device 11 is arranged, and the resin material 32' is formed in the region 36 that overlaps with the peripheral region 38 in which the driving circuit or the like is formed.

The resin materials 31' and 32' may be selected from an acrylic resin, an epoxy resin, a silicone resin, or the like. What is important is that the value of the linear expansion coefficient for the resin material 32' (the resin member 32) is greater than that for the resin material 31' (the resin member 31), as described above. The value of the linear expansion coefficients are selected from a range of greater than or equal to $1 \times 10^{-6}/°$ C. and less than $1 \times 10^{-2}/°$ C. In addition, it is sufficient if there is a difference of one order of magnitude or more between the linear expansion coefficient for the resin material 31' (the resin member 31) and that for the resin material 32' (the resin member 32). In the present example, a material whose value for the linear expansion coefficient is on the order of $1 \times 10^{-5}/°$ C. is selected as the resin material 31', and a material whose value for the linear expansion coefficient is on the order or $1 \times 10^{-4}/°$ C. is selected as the resin material 32'.

In addition, in the region 35 where the resin material 31' is formed, if the semiconductor device 11 is an optical imaging device, the resin material 31' (the resin member 31) must be a transparent material (member) through which light transmits. From resin materials that have optical transparency, there is a tendency that typically, the larger the linear expansion coefficient for the resin material, the lower the refractive index. In order to have a difference in refractive indexes with that of the glass substrate used in the supporting substrate 20 in the present example be low, a material whose value for the linear expansion coefficient is $5.5 \times 10^{-5}/°$ C. is selected as the resin material 31'.

The resin material 32' (the resin member 32) is arranged in the region 36 which overlaps with the peripheral region 38 of the semiconductor substrate 10, and thus does not need to be particularly transparent, and a colored material (member) may be selected for the resin material 32' (the resin member 32). In addition, because no micro lenses ML or color filters CF are formed in the region that overlaps with the region 36 of the semiconductor device 11 (or it is a dummy pattern even if they are formed), even if shrinkage change of the resin material 32' occurs due to thermal contraction, influence on the semiconductor device 11 due to stress of the shrinkage deformation is very small.

For a method for forming the resin materials 31' and 32', they may be formed by using a spinner, they may be formed by discharge using an inkjet method or a dispense method, and they may be formed by screen printing. In addition, if they are materials in a laminated film shape, a patterning process may be performed after they are bonded to the front side 39 of the semiconductor substrate 10 and subjected to photolithography processes such as an exposure process and a development process. The two types of resin materials 31' and 32' may each be formed by the same method, and may be formed by using mutually different methods. In the present example, the resin material 31' is formed first by screen printing, and subsequently the resin material 32' is formed by using a dispense method.

In the present example, film thicknesses for when the resin material 31' and the resin material 32' are formed are both approximately 30 μm. In the step illustrated in FIG. 3B, it is necessary that the film thicknesses of the resin material 31' and the resin material 32' are film thicknesses that are approximately equal. For example, the film thickness of the resin material 31' may be the same as the film thickness of the resin material 32'. In addition, for example, the film thickness of the resin material 31' may be in a range of ±20% with respect to the film thickness of the resin material 32', and the film thickness of the resin material 32' may be in a range of ±20% with respect to the film thickness of the resin material 31'. If one of the resin material 31' and the resin material 32' is formed thicker than the other, it is possible that the resin material which was thinly formed will be unable to bond the semiconductor substrate 10 and the supporting substrate 20. As a result, it is possible that the result described above will not be achievable. In a step of bonding the semiconductor substrate 10 and the supporting substrate 20, the film thickness of the resin material 31' and the film thickness of the resin material 32' are selected so that both of the resin material 31' and the resin material 32' contact with both of the semiconductor substrate 10 and the supporting substrate 20.

In addition, in the step illustrated in FIG. 3B, the supporting substrate is prepared. In the present example, because the semiconductor device 11 is an imaging device, a transparent glass substrate having optical transparency and thickness of approximately 500 μm is prepared, as the supporting substrate 20, at a size that is the same as that of the wafer on which the semiconductor substrate 10 is formed.

Next, in the step illustrated in FIG. 3C, firstly, the supporting substrate 20 and the semiconductor substrate 10 that was prepared in the step illustrated in FIG. 3B are aligned in a vacuum chamber, and then a vacuum evacuation process is performed inside the vacuum chamber. The inside of the chamber is decompressed until a degree of vacuum of 10 Pa or less, and air bubbles included inside the resinous components of the resin materials 31' and 32' are discharged. Subsequently, a process for bonding the semiconductor substrate 10 and the supporting substrate 20 is performed while applying a weight of approximately 100 kg (1 kN), and then the chamber is returned to ambient atmosphere.

At this stage, the resin materials 31' and 32' are not yet completely cured, but the semiconductor substrate 10 and the supporting substrate 20 have an adhesion join (are bonded) via the resin materials 31' and 32'. Subsequently, the back side 40 of the semiconductor substrate 10 is grinded by a back grinding process, making the thickness of the semiconductor substrate 10 thinner until it is approximately 100 μm. Here, if there is concern regarding the adhesive strength between the semiconductor substrate 10 and the supporting substrate 20, a supporting substrate other than the supporting substrate 20 may be used to make the semiconductor substrate 10 thinner in advance before bonding the semiconductor substrate 10 and the supporting substrate 20.

Next, in the step of FIG. 3D, a heating apparatus is used to cure the resin materials 31' and 32', and the bonding layer 30, which is configured by the resin members 31 and 32, is formed. In the present example, a heating oven is used to perform processing for one hour at 120° C., but UV treatment or the like may be performed as necessary before curing.

When curing in accordance with the heating process ends, the resin members 31 and 32 (the resin materials 31' and 32') have values of linear expansion coefficients that are different from one another by one order of magnitude or more, and therefore undergo heat shrinkage after cooling with the respective linear expansion coefficients. At this point, the resin member 32 has a larger amount of heat shrinkage than the resin member 31, and the thickness of the semiconductor substrate 10 is thinner than the supporting substrate 20. Accordingly, the region out of the semiconductor substrate 10 that overlaps with the region 35 in which the resin member 31 of the bonding layer 30 is arranged is, with respect to the supporting substrate 20, a curved shape having a convex shape in a direction away from the supporting substrate 20.

A necessary size of the curved shape changes by the size of the semiconductor substrate 10 or the size of the image capturing region 37 of the semiconductor device 11. Accordingly, the warpage amount of the semiconductor substrate 10 can be controlled by adjusting the values of the linear expansion coefficients of the resin members 31 and 32 (the resin materials 31' and 32'), the thicknesses of the resin members 31 and 32, and the sizes of the regions in which the resin members 31 and 32 are arranged. Here, in the present example, description was given that the region 35 overlaps with the image capturing region 37 and that the region 36 overlaps with the peripheral region 38, but there is no limitation to this. For example, the region 35 in which the resin member 31 is arranged may extend to a portion of the peripheral region 38 of the semiconductor substrate 10. For example, conversely, the region 36 in which the resin member 32 is arranged may extend to the image capturing region 37 of the semiconductor substrate 10. In accordance with the necessary curved shape and warpage amount of the semiconductor substrate 10, the resin member 31 may be arranged at a central portion of the semiconductor substrate 10 and the resin member 32 may be arranged between the outer edge of the resin member 31 and the outer edge of the semiconductor substrate 10.

In the step illustrated in FIG. 3E, firstly, a mask pattern is formed on the back side 40 of the semiconductor substrate 10, and a hole for arranging the TSV 12 is formed by a dry etching process. In the present example, the hole is formed by using a so-called Bosch process to perform an etching process in a vertical direction on the silicon substrate of the semiconductor substrate 10 in a direction from the back side 40 to the front side 39. The hole is formed so that the TSV 12, which is formed inside the hole, connects to the electrode PAD formed in the front side 39 of the semiconductor substrate 10. The TSV 12 is arranged, in an orthographic projection to the front side 39 of the semiconductor substrate 10, in a region, out of the semiconductor substrate 10, that overlaps with the region 36 in which the resin member 32 is arranged. In other words, the TSV 12 is arranged, in an orthographic projection to the front side 39 of the semiconductor substrate 10, in a region, out of the semiconductor substrate 10, that overlaps with the peripheral region 38 in which the electrode PAD of the semiconductor device 11 is arranged. The region out of the semiconductor substrate 10 that overlaps with the region 36 and the peripheral region 38 of the semiconductor device 11 has a smaller curve in comparison to the region that overlaps with the region 35 and the image capturing region 37, as illustrated by FIG. 3E.

For this reason, formation of the hole and the TSV 12 is unlikely to be affected by the curved shape of the semiconductor substrate 10.

Next, the insulating member 13 is formed on the entire surface of the back side 40 of the semiconductor substrate 10, which includes the sides of the hole and the exposed surface of the electrode PAD. The insulating member 13 may be formed by using a material such as silicon oxide or silicon nitride. In the present example, approximately 1.5 μm of silicon oxide is formed by plasma CVD (Chemical Vapor Deposition) as the insulating member 13. Subsequently, the insulating member 13 that was deposited on the electrode PAD is removed by etching back in accordance with dry etching. Capacitively-coupled reactive ion etching (ME), which uses a gas mixture of $CF_4$, $C_4F_8$, $O_2$, and Ar, is used for the dry etching.

Next, a barrier metal film and a seed metal film are formed by a sputtering method or the like on the insulating member 13 and on the electrode PAD, and a photo-mask formed thereon by a resist material is used to deposit electrode material in accordance with a plating process or the like to thereby form the TSV and the wiring layer 14. In the present example, the sputtering method is respectively used to deposit titanium (Ti) to a thickness of 1 μm as the barrier metal film, and copper (Cu) to a thickness of 800 nm as the seed metal film. Subsequently, copper (Cu) is formed to approximately 8 μm by a plating process, and then, by removing the resist material, and removing the barrier metal film and the seed metal film unnecessary for wiring by an etching process, the TSV 12 and the wiring layer 14 are formed.

The wiring layer 14 is formed on a portion of the image capturing region 37 that is in a curved shape. However, because the wiring layer 14 has a wide width of approximately several tens of μm in comparison to the typical width of wiring in a semiconductor, it tends not to be influenced by the curved shape. In addition, even if, hypothetically, the wiring layer 14 is influenced by the curved shape, an influence on the value of wiring resistance would be small.

Furthermore, publicly known semiconductor processes are used to apply a solder resist (not shown), and install solder balls (not shown), as necessary. In addition, a desired semiconductor apparatus 1 is completed after passing a step such as a dicing process.

As described above, in the semiconductor apparatus 1 of the present example, the semiconductor substrate 10 curves to have a convex shape away from the supporting substrate 20. Accordingly, shift of the focal position between the central portion and the peripheral portion of the image capturing region 37 of the semiconductor device 11 is suppressed, and it is possible to reduce a number or combination of lenses arranged upward of the supporting substrate 20. Furthermore, because the semiconductor substrate 10 and the supporting substrate 20 can be processed at wafer-size, it is unnecessary to create a curved shape by using a separate jig or the like with respect to the semiconductor apparatus 1. As a result, it is possible to simultaneously fabricate a plurality of semiconductor apparatuses 1 having a predetermined curved shape by a simpler method, and with the possibility of a size reduction.

Second Example

FIGS. 4A to 4E are schematic drawings for describing each step of a method of manufacturing the semiconductor apparatus 1' described above. A publicly known semiconductor manufacturing process may be used to manufacture the semiconductor apparatus 1'. In addition, while description is omitted here, a heat process, a cleaning process, or the like may be performed between steps as necessary.

Figure 4A:
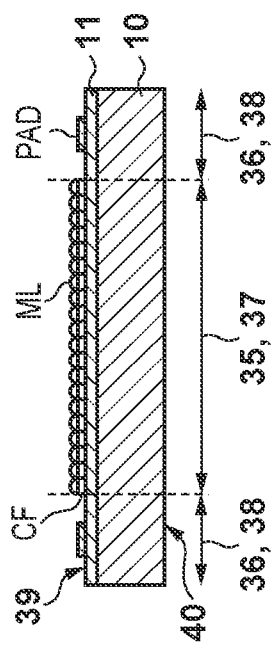
FIGS. 4A to 4E are views for illustrating a method of manufacturing the semiconductor apparatus illustrated by FIGS. 2A and 2B.

The step illustrated in FIG. 4A may be the same as the step illustrated by FIG. 3A of the first example described above, and thus description is omitted here. Next, in the step illustrated in FIG. 4B, the resin material 32' is formed on the front side 39 of the semiconductor substrate 10. The region in which the resin material 32' is formed is the region 36 that overlaps with the peripheral region 38 in which the driving circuit and the like are formed out of the semiconductor device 11, similarly to in the first example. In addition, in such a case, differing from the first example described above, a resin material is not arranged in the region 35, out of the semiconductor device 11, that overlaps with the image capturing region 37 in which the photoelectric conversion element is formed.

For the material used for the resin material 32', similar material to that of the first example may be selected. The value of the linear expansion coefficient of the resin material 32' may be selected from a range of greater than or equal to $1 \times 10^{-6}/°$ C. and less than $1 \times 10^{-2}/°$ C., and a material having a value whose linear expansion coefficient is large may be selected. In the present example, an acrylic resin material whose linear expansion coefficient value is on the order of $10^{-4}/°$ C. is selected, and screen printing is used to form the resin material 32' at a thickness of approximately 60 In addition, similarly to in the first example, a glass substrate having optical transparency, a thickness of approximately 500 μm, and a size the same as the wafer in which the semiconductor substrate 10 is formed is prepared as the supporting substrate 20.

Figure 4B:
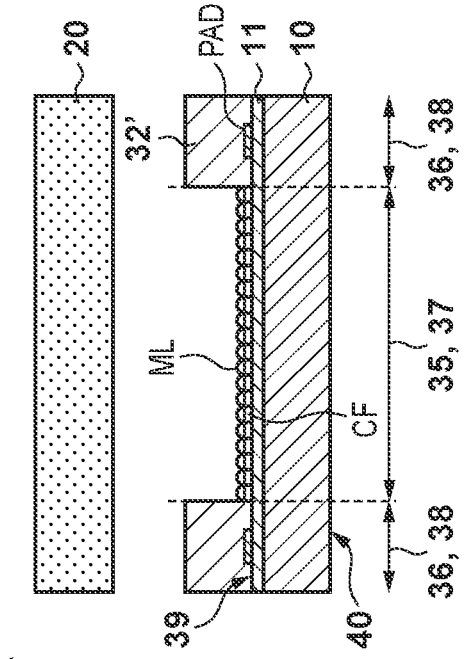
Figure 4C:
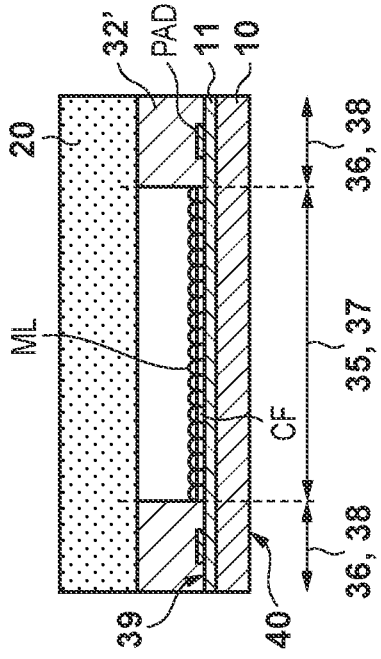

In the step illustrated in FIG. 4C, firstly, the semiconductor substrate 10, on which the resin material 32' prepared by the step illustrated in FIG. 4B is formed, and the supporting substrate 20 are aligned in a vacuum chamber, and then a vacuum evacuation process is performed inside the vacuum chamber. At this point, differing from the first example described above, the ultimate vacuum is approximately half of atmospheric pressure. As described above, a resin material is not provided in the region 35 that overlaps with the image capturing region 37 of the semiconductor device 11, and is a hollow structure. Accordingly, by decompressing the hollow region 35 to approximately half atmospheric pressure and then bonding and ultimately pressing at atmospheric pressure, the pressure in inner volume of the hollow region 35 changes to pressure that is equivalent to atmospheric pressure. In accordance with this, the resin material 32' is crushed to approximately half, and it is possible to control the gap of the hollow region 35. In the present example, by setting the ultimate vacuum to 55000 Pa, and, after bonding, performing atmospheric air opening inside the vacuum chamber to thereby fabricate a desired structure. The ultimate vacuum is not limited to 55000 Pa, and, for example, may be greater than or equal to 10000 Pa and less than or equal to 90000 Pa. The ultimate vacuum may be appropriately set in accordance with the hardness of the resin material 32', the size of the regions 35 and 36 (the width of the region 36 in which the resin material 32' (the resin member 32) is arranged), the gap of the region 35, or the like.

In addition, the reason why there is no need to set the degree of vacuum to be higher than that in the first example described above is because, as the region in which the resin material 32' is arranged is the region 36 which is close to the outer edge of the semiconductor substrate 10, even if, hypothetically, an air bubble remains inside the resin material 32' (the resin member 32), there is little influence on the image capturing region 37. In addition, in the present example, because there is no need to have a strong vacuum inside the vacuum chamber, it is possible to shorten processing time required to bond the semiconductor substrate 10 and the supporting substrate 20.

At this stage, the resin material 32' is not yet completely cured, but the semiconductor substrate 10 and the supporting substrate 20 have an adhesion join (are bonded) via the resin material 32'. Subsequently, the back side 40 of the semiconductor substrate 10 is grinded by a back grinding process, making the thickness of the silicon substrate thinner until it is approximately 100 μm. At this point, if there is concern regarding the adhesive strength, a separate supporting substrate may be used to thin the semiconductor substrate 10 in advance, before the semiconductor substrate 10 and the supporting substrate 20 are bonded.

Figure 4D:
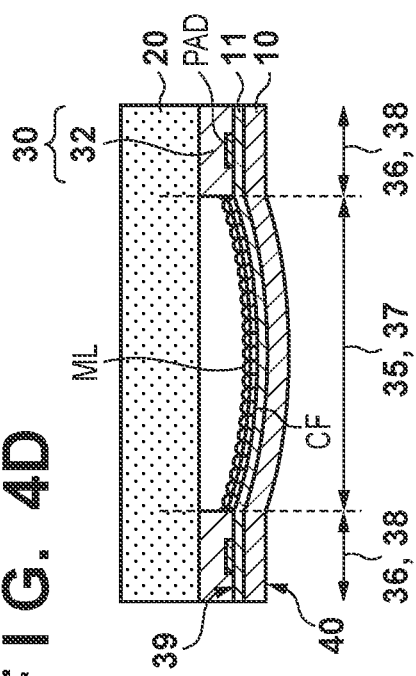
Figure 4E:
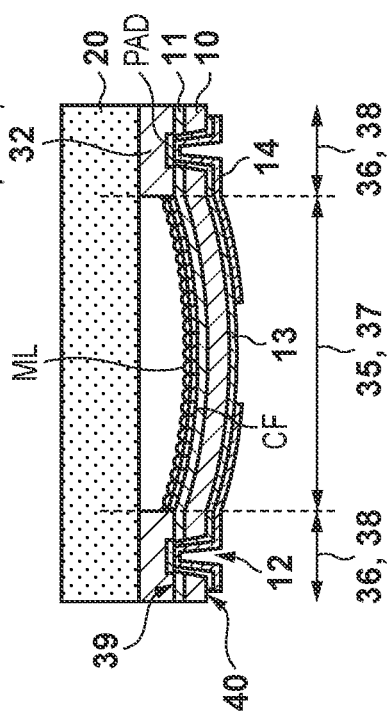

Next, in the step illustrated by FIG. 4D, a heating apparatus is used to cure the resin material 32', and the bonding layer 30, which is configured by the resin member 32, is formed. In the present example, a heating oven is used to perform processing for one hour at 120° C., but UV treatment or the like may be performed as necessary before curing.

When curing in accordance with the heating process ends, heat shrinkage in accordance with cooling occurs for the resin member 32 (the resin material 32'), because a member (material) whose linear expansion coefficient value is greater than a typical resin has been selected. At this point, although the resin member 32 gets thinner in the thickness direction due to the heat shrinkage, there is a tendency for its volume to increase in order to maintain the pressure in the hollow region. In the present example, because the thickness of the semiconductor substrate 10 is thinner than the thickness of the supporting substrate 20, the semiconductor substrate 10 becomes a convex curved shape in a direction away from the supporting substrate 20. Similar to the embodiments and examples described above, warpage of the semiconductor substrate 10 may be controlled so that the region that overlaps with the image capturing region 37 of the semiconductor device 11 and the region 35, out of the semiconductor substrate 10, curves.

In the present example, thermosetting is performed after the internal pressure in the region 35 is equalized with atmospheric pressure, but there is no limitation to having the internal pressure of the region 35 be atmospheric pressure when performing thermosetting. For example, instead of pressing the semiconductor substrate 10 and the supporting substrate 20 at atmospheric pressure so that the internal pressure of the hollow region 35 becomes greater than or equal to atmospheric pressure after bonding, bonding may be performed so that the thickness of the resin material 32' becomes half or less by position control for a pressing mold, under vacuum that is approximately half of atmospheric pressure. In such a case, because the pressure of the hollow region 35 shifts to a pressure that is higher than atmospheric pressure due to the heat shrinkage after the heating process, it is possible to increase the warpage amount of the semiconductor substrate 10.

The necessary size of the curved shape and the warpage amount of the semiconductor substrate 10 change by the size of the semiconductor substrate 10 and the size of the image capturing region 37. A variable amount of the warpage of the semiconductor substrate 10 can be controlled by adjusting the value of the linear expansion coefficient of the resin material 32', the size (width) or the film thickness of the resin member 32, the pressure inside the hollow region 35 at a time of bonding, or the like. The step illustrated by FIG. 4E which is performed after the step illustrated by FIG. 4D may be the same as the step illustrated by FIG. 3E of the first example described above, and thus description is omitted here.

In the present example, it is possible to achieve a similar effect to that of the first example described above. In addition, differing from the first example, if the semiconductor apparatus 1' is an image capturing apparatus by a resin member not being arranged in the region 35, it is possible to reduce optical influence due to a foreign particle, a remaining air bubble, or the like inside the resin member.

As an application of the semiconductor apparatus 1 or 1' according to the embodiments and examples described above, illustrative description is given below regarding a camera in which the semiconductor apparatus 1 or 1' is embedded. Here, the semiconductor apparatus 1 or 1' may be a so-called image capturing apparatus that is provided with an imaging device in which a photoelectric conversion element is arranged as the semiconductor device 11, as in the embodiments and examples described above. A concept for the camera includes not only an apparatus whose main purpose is image-capturing, but an apparatus which is supplementally provided with an image-capturing function (for example, a personal computer or a mobile terminal). The camera includes the semiconductor apparatus 1 or 1' according to the present invention exemplified as the embodiments and examples described above, and a signal processing unit for processing information based on a signal outputted from the semiconductor apparatus 1 or 1'. The signal processing unit may include a processor for processing digital data that is image data. The processor can perform processing to calculate a defocus amount based on the signal from a pixel that has focus detection function of the semiconductor apparatus 1 or 1', and controlling focus control of an imaging lens based on this. An A/D converter for generating image data described above, can be provided by the semiconductor apparatus 1 or 1', and can also be provided separate to the semiconductor apparatus 1 or 1'.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-024335, filed Feb. 14, 2018, which is hereby incorporated by reference herein in its entirety.

What is claimed is:

1. A semiconductor apparatus comprising:
a semiconductor substrate in which a semiconductor element is arranged; and
a supporting substrate,
wherein:
the semiconductor substrate is bonded to the supporting substrate by a bonding layer;
the bonding layer is arranged between the supporting substrate and a front side of the semiconductor substrate on a side of the supporting substrate;
the bonding layer includes a first resin member arranged on a first region of the semiconductor substrate and a second resin member arranged on a second region of the semiconductor substrate, the first region being inside of an outer edge of the semiconductor substrate and the second region being between the outer edge of the semiconductor substrate and the first region; and
a linear expansion coefficient of the first resin member is less than a linear expansion coefficient of the second resin member.

2. The semiconductor apparatus according to claim 1, wherein the semiconductor substrate has a convex shape in a direction away from the supporting substrate.

3. The semiconductor apparatus according to claim 1, wherein the linear expansion coefficients of the first resin member and the second resin member are $1\times10^{-6}/^\circ$ C. to less than $1\times10^{-2}/^\circ$ C.

4. The semiconductor apparatus according to claim 1, wherein the linear expansion coefficient of the first resin member is less than or equal to $1/10$ of the linear expansion coefficient of the second resin member.

5. The semiconductor apparatus according to claim 1, wherein the first resin member is transparent.

6. The semiconductor apparatus according to claim 1, wherein a region of the semiconductor substrate that overlaps with the first region has a convex shape in a direction away from the supporting substrate.

7. The semiconductor apparatus according to claim 1, wherein the thickness of the semiconductor substrate is smaller than the thickness of the supporting substrate.

8. The semiconductor apparatus according to claim 1, wherein the outer edge of the semiconductor substrate and an outer edge of the supporting substrate are arranged to overlap with each other.

9. The semiconductor apparatus according to claim 1, wherein the bonding layer seals the semiconductor element.

10. The semiconductor apparatus according to claim 1, wherein the semiconductor substrate has a plurality of photoelectric conversion elements that overlap with the first region.

11. The semiconductor apparatus according to claim 1, wherein the supporting substrate is transparent.

12. The semiconductor apparatus according to claim 1, wherein a through electrode that penetrates the semiconductor substrate and is electrically connected to the semiconductor element is arranged in a region that overlaps with the second region.

13. The semiconductor apparatus according to claim 12, wherein:
a wiring layer configured to perform an electrical connection with a mounting substrate for mounting the semiconductor apparatus is arranged on a back side of the semiconductor substrate, which is a side of the semiconductor substrate that is opposite to the front side of the semiconductor substrate; and
the wiring layer is electrically connected to the through electrode.

14. A camera, comprising:
a semiconductor apparatus according to claim 1; and
a processing unit configured to process a signal outputted from the semiconductor apparatus.

* * * * *